United States Patent [19]
Lur et al.

[11] Patent Number: 5,366,925
[45] Date of Patent: Nov. 22, 1994

[54] LOCAL OXIDATION OF SILICON BY USING ALUMINUM SPIKING TECHNOLOGY

[75] Inventors: Water Lur, Taipei; Jiunn Y. Wu, Dou-Lio; Shim F. Tzou, Chu-Tung, all of Taiwan, Prov. of China

[73] Assignee: United Microelectronics Corporation, Hsinchu, Taiwan, Prov. of China

[21] Appl. No.: 126,872

[22] Filed: Sep. 27, 1993

[51] Int. Cl.$^5$ ............................................. H01L 21/76
[52] U.S. Cl. ...................................... 437/70; 437/38; 437/72; 437/231
[58] Field of Search ...................... 437/38, 67, 70, 72, 437/231; 148/DIG. 50, DIG. 70

[56] References Cited

U.S. PATENT DOCUMENTS

| | | | |
|---|---|---|---|
| 4,211,582 | 7/1980 | Horng et al. | 148/1.5 |
| 4,656,497 | 4/1987 | Rogers et al. | 357/50 |
| 4,836,885 | 6/1989 | Breiten et al. | 156/643 |
| 4,868,136 | 9/1989 | Ravaglia | 437/38 |
| 4,876,216 | 10/1989 | Tobias et al. | 437/67 |
| 4,937,202 | 6/1990 | Maas | 437/38 |
| 4,988,639 | 1/1991 | Aomura | 437/67 |
| 5,017,999 | 5/1991 | Roisen et al. | 357/49 |
| 5,096,848 | 3/1992 | Kawamura | 437/67 |
| 5,108,946 | 4/1992 | Zdebel et al. | 437/72 |
| 5,130,268 | 7/1992 | Liou et al. | 437/72 |
| 5,141,888 | 8/1992 | Kawaji et al. | 437/70 |

OTHER PUBLICATIONS

VLSI Technology, International Edition, by S. M. Sze, McGraw Hill Book Co., pp. 473–474 and 476–477, 1987
"Formation of Silicon Nitride at a Si–SiO$_2$ Interface During Local Oxidation of Silicon & During Heat—Treatment of Oxidized Silicon in NH$_2$ Gas" by E. Kooi, J. G. van Lierop and J. A. Appels, J. Electrochem Soc., Solid–State Science and Technology, Jul. 1976, pp. 1117–1120.

Primary Examiner—Brian E. Hearn
Assistant Examiner—Chandra Chaudhari
Attorney, Agent, or Firm—George D. Saile

[57] ABSTRACT

A first thin silicon oxide layer is formed the surface of a silicon substrate. A silicon nitride layer is deposited overlying said first thin silicon oxide layer. Portions of the silicon nitride layer and the first thin silicon oxide layer not covered by a mask pattern are etched through to the silicon substrate to provide a plurality of wide and narrow openings exposing portions of the silicon substrate that will form the device isolation regions. A layer of aluminum is deposited overlying the patterned nitride and first thin silicon oxide layers. A first layer of silicon oxide is deposited overlying the aluminum layer. The substrate is annealed whereby the aluminum layer reacts with the exposed portions of the silicon substrate within the openings to form an aluminum-silicon alloy wherein the alloy forms trenches into the surface of said substrate. The silicon oxide layer and the aluminum and aluminum-silicon alloy layers are removed leaving trenches in the substrate where device isolation regions are to be formed. A second thin layer of silicon oxide is grown over the surfaces of the nitride layer and conformally within the trenches. Channel-stops are selectively ion implanted through the openings into the substrate underneath the trenches. There are many methods to fill in the trenches such as photoresist etchback, BPSG reflow, chemical mechanical polishing, spin-on-glass planarization, etc., to complete the device isolation of the integrated circuit.

28 Claims, 2 Drawing Sheets

LOCAL OXIDATION OF SILICON BY USING ALUMINUM SPIKING TECHNOLOGY

BACKGROUND OF THE INVENTION

1. FIELD OF THE INVENTION

This invention relates to the fabrication of integrated circuit devices and more particularly to a method of local oxidation using aluminum spiking technology in the fabrication of integrated circuits.

2. DESCRIPTION OF THE PRIOR ART

Local oxidation of silicon is the conventional lateral isolation scheme. The conventional local oxidation process (LOCOS) is described in *VLSI Technology*, International Edition, by S. M. Sze, McGraw-Hill Book Company, N.Y., N.Y., c. 1988 by McGraw-Hill Book Co., pp. 473–74. A layer of silicon nitride is deposited over a pad oxide overlying a silicon substrate. The pad oxide is a thin thermal oxide which allows better adhesion between the nitride and silicon and acts as stress relaxation layer during field oxide formation. The nitride and oxide layers are etched to leave openings exposing portions of the silicon substrate where the local oxidation will take place. A boron channel-stop layer is ion implanted into the isolation regions. The field oxide is grown within the openings and the nitride and pad oxide layers are removed. This completes the local oxidation.

On pp. 476–477 of the aforementioned textbook, Sze describes some of the disadvantages of the growth of field oxide using the local oxidation method. The field oxide will penetrate under the masking nitride layer causing the space between transistors to grow during oxidation. This oxide growth under nitride is called "bird's beak encroachment." Other problems include stress in the oxide in the region covered by the nitride mask, white ribbon effect thinning of the field oxide in narrow openings, and a non-recessed surface.

Many new isolation processes have been developed to overcome these drawbacks. Trench isolation schemes are the most attractive candidates. Typically, deep narrow trenches are used to isolate one device from another. Shallow trenches are used to isolate elements within a device, and wide trenches are used in areas where interconnection patterns will be deposited. Unfortunately, simple trench isolation method cannot be implemented on large area openings. A number of solutions to this problem have been proposed. U.S. Pat. Nos. 4,836,885 to Breiten et al and 4,876,216 to Tobias et al describe methods for overcoming trench isolation problems using resist etchback techniques. U.S. Pat. No. 4,656,497 to Rogers et al uses reflow of doped glass at high temperatures. U.S. Pat. Nos. 5,017,999 to Roisen et al, 5,108,946 to Zdebel et al, and 5,130,268 to Liou et al describe using reoxidation of solid-phase growth polysilicon. U.S. Pat. Nos. 4,211,582 to Horng et al and 4,988,639 to Aomura use two step oxidation with plurality mask techniques and U.S. Pat. Nos. 4,868,136 to Ravaglia and 5,096,848 to Kawamura describe a combination of LOCOS and trench techniques. However, in each of these processes there exist some inherent drawbacks such as productivity, repeatability, complexity and maturity, as well as global planarization.

SUMMARY OF THE INVENTION

A principal object of the invention is to provide an effective and very manufacturable method to locally oxidize the silicon in an integrated circuit.

Another object of the present invention is provide a method of local oxidation of silicon that will have no "bird's beak" or white ribbon effect.

Yet another object is to provide a method of local oxidation which is free of oxide thinning in narrow openings.

Yet another object of the invention is provide a method of locally oxidizing the silicon in an integrated circuit whereby a minimum of stress is generated.

Yet another object is to provide a method of local oxidation which incorporates global planarization In accordance with the objects of this invention, a new method of local oxidation using aluminum spiking technology is achieved. A first thin silicon oxide layer is formed on the surface of a silicon substrate. A silicon nitride layer is deposited overlying said first thin silicon oxide layer. Portions of the silicon nitride layer and the first thin silicon oxide layer not covered by a mask pattern are etched through to the silicon substrate so as to provide a plurality of wide and narrow openings exposing portions of the silicon substrate that will form the device isolation regions. A layer of aluminum is deposited overlying the patterned silicon nitride and first thin silicon oxide layers. A first layer of silicon oxide is deposited overlying the aluminum layer. The substrate is annealed whereby the aluminum layer reacts with the exposed portions of the silicon substrate within the openings to form an aluminum-silicon alloy wherein the alloy forms trenches into the surface of said substrate. The silicon oxide layer and the aluminum and aluminum-silicon alloy layers are removed leaving trenches in the substrate where device isolation regions are to be formed. A second thin layer of silicon oxide is grown over the surfaces of the silicon nitride layer and conformally within the trenches. Channel-stops are selectively ion implanted through the openings into the substrate underneath the trenches. There are many methods to fill in the trenches such as photoresist etchback, BPSG reflow, chemical mechanical polishing, spin-on-glass planarization, and the like, to complete the device isolation of the integrated circuit.

BRIEF DESCRIPTION OF THE DRAWINGS

In the accompanying drawings forming a material part of this description, there is shown.

DESCRIPTION OF THE PREFERRED EMBODIMENTS

Figure 1:
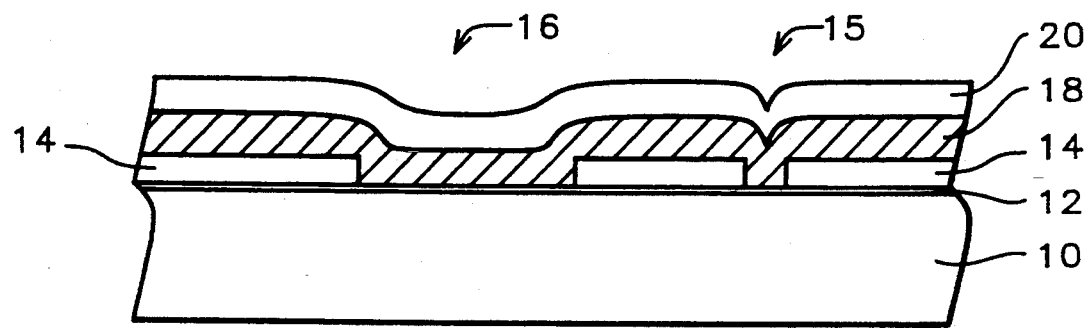
FIGS. 1 through 4 schematically illustrate in cross-sectional representation one preferred embodiment of this invention.

Referring now more particularly to FIG. 1, there is shown a monocrystalline silicon substrate 10. A layer 12 of thin silicon oxide is formed on the surface of the substrate by thermal oxidation or chemical vapor deposition (CVD) to a preferred thickness of between about 50 to 300 Angstroms. A layer 14 of silicon nitride is deposited by CVD over the thin silicon oxide layer 12. A field oxide (FOX) mask pattern is laid over the surface of the substrate and the layers 12 and 14 are etched to provide narrow openings 15 and wide openings 16 to expose portions of the silicon substrate where the device isolation regions are to be formed. A layer of aluminum 18 is sputter deposited to a preferred thickness of between about 2000 to 4000 Angstroms over the patterned surface of the substrate. A first layer of silicon dioxide 20 is deposited by CVD to a thickness of between about 500 to 2000 Angstroms over the surface of the aluminum layer 18. Silicon nitride or titanium nitride could be used in place of the silicon dioxide for layer 20.

Figure 2:
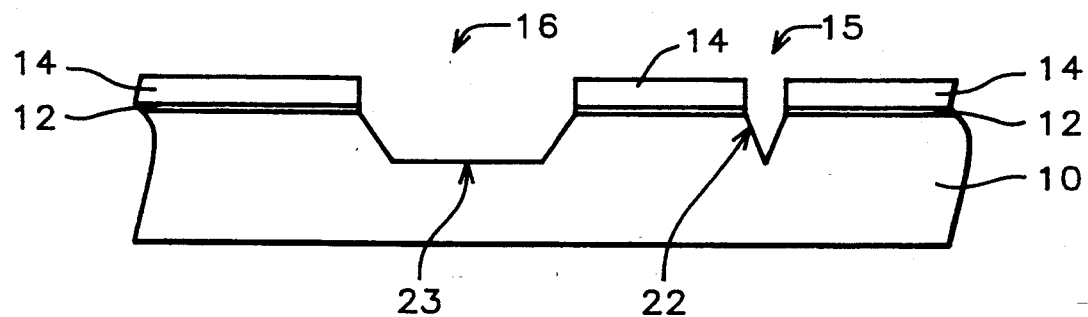

The substrate is annealed by rapid thermal annealing (RTA) at a temperature of between about 600° to 750° C. for 20 to 60 seconds. Where the aluminum contacts the silicon substrate within the openings 15 and 16, an aluminum-silicon alloy is formed in the silicon substrate in a trench shape. The silicon oxide layer 20 is stripped by a reactive ion etch using $C_2F_6$ or the like as well as a hydrofluoric acid solution. The aluminum and aluminum-silicon alloy layer 18 are removed by dipping the wafer in a sulfuric acid or the like, leaving trenches 22 and 23 within the silicon substrate at the openings 15 and 16, as shown in FIG. 2. The slope of the sides of the trenches will always be 54.7°; that is the angle between the silicon crystalline planes {100} and {111}.

Figure 3:
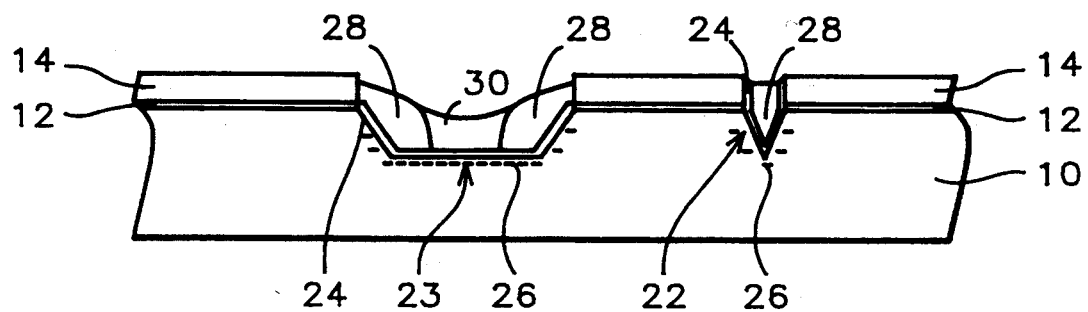

Referring now to FIG. 3, a second thin silicon oxide layer 24 is grown over the surface of the substrate and conformally within the trenches 22 and 23 to a thickness of between about 50 to 200 Angstroms. This thin oxide layer is used to remove all surface defects and acts as a thin protecting layer against contaminants during subsequent channel-stop implantation.

Channel-stops 26 are selectively ion implanted into the substrate through the openings 15 and 16. Boron ions are implanted with a dosage of between about 1 E 13 to 1 E 14 atoms/$cm^2$ and at an energy of between about 10 to 50 KeV. The channel-stop implants prevent the inversion of p-type silicon under the field oxide.

There are many methods that can be used to fill the trenches, such as photoresist etchback, BPSG fellow, chemical mechanical polishing, spin-on-glass planarization, and the like. An example is described herein.

A second layer of silicon oxide 28 is deposited over the surface of the substrate to a thickness of between about 4000 to 8000 Angstroms. This layer is etched to leave silicon oxide spacers on the sidewalls of the silicon nitride layer 14. These spacers fill the narrow trenches 22, but do not fill the central portions of the wide trenches 23.

A coating of spin-on-glass material is applied over all surfaces of the substrate and within the wide trenches 23. The spin-on-glass layer is baked and cured. Alternatively, a layer of borosilicate glass (BSG) or borophosphosilicate glass (BPSG) is deposited over the surfaces of the substrate and within the wide trenches 23 and reflowed. This spin-on-glass, BSG, or BPSG layer 30 has a thickness of between about 3000 to 6000 Angstroms. The layer 30 is etched back so that it remains only within the wide trenches 23. This fills the wide trenches with a smooth planarized dielectric. Polyimide is also an alternative to fill the wide trenches.

Figure 4:
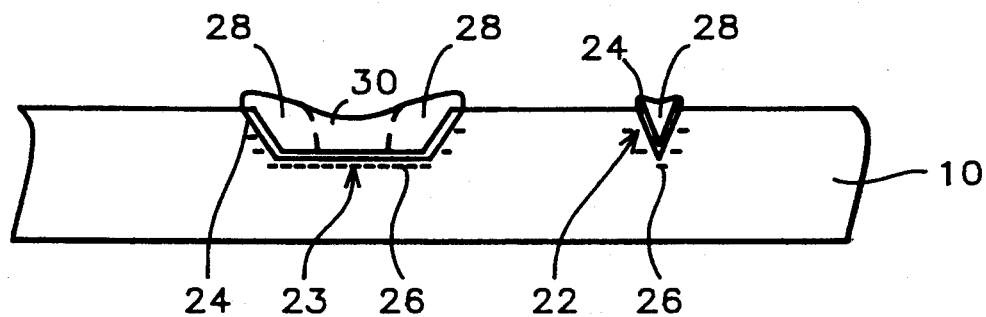

Referring now to FIG. 4, the silicon nitride layer 20 is stripped by dipping the wafer in phosphoric acid and the first thin silicon oxide layer 12 is removed by dipping the wafer in a hydrofluoric acid solution for a short time. This completes the device isolation of the integrated circuit. Both wide and narrow openings have been filled and planarized without thinning of oxide in narrow openings. No "bird's beak" or white ribbon effects are produced. The process of the invention is a simple process with minimum time required for thermal treatments.

Figure 5:
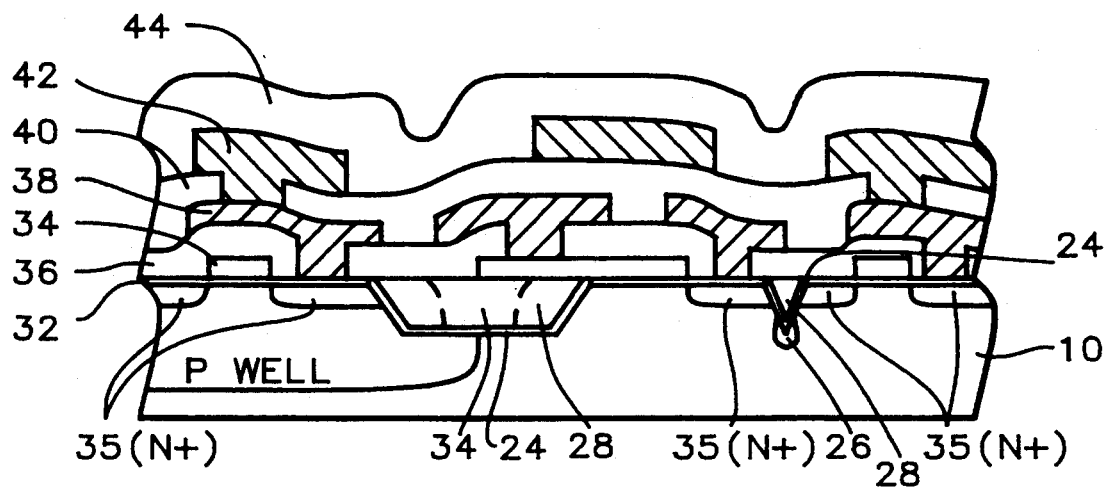
FIG. 5 schematically illustrates in cross-sectional representation a completed integrated circuit of the present invention.

The integrated circuit may be completed as is conventional in the art. For example, referring to FIG. 5, gate oxide layer 32 may be deposited followed by patterning to provide openings for buried contact regions. A threshold-adjust ion implant may be required at this point. Next, gate electrode 34 and source/drain regions 35 are fabricated. Dielectric layer 36, which may be a phosphorus-doped chemical vapor deposited oxide or BPSG is deposited. Contact openings are etched through the dielectric layer to expose the source/drain regions where contacts are desired. Metal layer 38, typically aluminum, is deposited and patterned to complete contacts to the source/drain regions followed by an intermetal dielectric layer 40 and second metallization A top capping layer 44 of silicon nitride and/or an oxide 42. completes formation of the integrated circuit.

While the invention has been particularly shown and described with reference to the preferred embodiments thereof, it will be understood by those skilled in the art that various changes in form and details may be made without departing from the spirit and scope of the invention.

What is claimed is:

1. The method of forming device isolation regions of an integrated circuit using aluminum spiking technology comprising:

providing a first thin silicon oxide layer over the surface of a silicon substrate;

depositing a silicon nitride layer overlying said first thin silicon oxide layer;

etching through portions of said silicon nitride layer and said first thin silicon oxide layer not covered by a mask pattern to said silicon substrate so as to provide a plurality of wide and narrow openings exposing portions of said silicon substrate that will form the said device isolation regions;

depositing a layer of aluminum overlying said patterned silicon nitride and first thin silicon oxide layers;

depositing a first layer of silicon oxide overlying said aluminum layer;

annealing said substrate whereby said aluminum layer reacts with said exposed portions of said silicon substrate within said openings to form an aluminum-silicon alloy wherein said alloy forms trenches into the surface of said substrate;

removing said first silicon oxide layer;

removing said aluminum and said aluminum-silicon alloy layers leaving trenches in the substrate where device isolation regions are to be formed;

growing a second thin layer of silicon oxide over the surfaces of said silicon nitride layer and conformally within said trenches;

selectively ion implanting channel-stops through said openings into said substrate underneath said trenches;

depositing a second layer of silicon oxide over the surface of said substrate and within said trenches;

etching back said second silicon oxide layer to leave spacers on the sidewalls of said trenches wherein said spacers fill said trenches within said narrow openings and wherein said spacers do not fill the central portion of said trenches within said wide openings;

covering the surface of said substrate with a spin-on-glass material and baking and curing said spin-on-glass layer;

etching back said spin-on-glass layer leaving said spin-on-glass material only within said central portion of said trenches within said wide openings; and removing said silicon nitride layer and said first thin silicon oxide layer thereby completing said device isolation of said integrated circuit.

2. The method of claim 1 wherein said first thin silicon oxide layer has a preferred thickness of between about 50 to 300 Angstroms.

3. The method of claim 1 wherein said silicon nitride layer has a preferred thickness of between about 500 to 2000 Angstroms.

4. The method of claim 1 wherein said aluminum layer sputter deposited to a preferred thickness of between is about 2000 to 4000 Angstroms.

5. The method of claim 1 wherein said first silicon oxide layer is deposited to a thickness of between about 500 to 2000 Angstroms.

6. The method of claim 1 wherein said annealing of said substrate is accomplished by rapid thermal annealing at between about 600° to 750° C. for about 20 to 60 seconds.

7. The method of claim 1 wherein said first silicon oxide is removed by reactive ion etching.

8. The method of claim 1 wherein said aluminum and said aluminum-silicon alloy are removed by dipping the wafer in a sulfuric acid.

9. The method of claim 1 wherein said second thin silicon oxide layer is grown to a thickness of between about 50 to 200 Angstroms.

10. The method of claim 1 wherein said channel-stop implantation uses boron ions with a dosage of between about 1 E 13 to 1 E 14 atoms/cm$^2$ and energy of between about 10 to 50 KeV.

11. The method of claim 1 wherein said second silicon oxide is deposited to a thickness of between about 4000 to 8000 Angstroms.

12. The method of claim 1 wherein the thickness of said spin-on-glass layer is between about 3000 to 6000 Angstroms.

13. The method of forming device isolation regions of an integrated circuit using aluminum spiking technology comprising:

providing a first thin silicon oxide layer over the surface of a silicon substrate;

depositing a silicon nitride layer overlying said first thin silicon oxide layer;

etching through portions of said silicon nitride layer and said first thin silicon oxide layer not covered by a mask pattern to said silicon substrate so as to provide a plurality of wide and narrow openings exposing portions of said silicon substrate that will form the said device isolation regions;

depositing a layer of aluminum overlying said patterned silicon nitride and first thin silicon oxide layers;

depositing a first layer of silicon oxide overlying said aluminum layer;

annealing said substrate whereby said aluminum layer reacts with said exposed portions of said silicon substrate within said openings to form an aluminum-silicon alloy wherein said alloy forms trenches into the surface of said substrate;

removing said first silicon oxide layer;

removing said aluminum and said aluminum-silicon alloy layers leaving trenches in the substrate where device isolation regions are to be formed;

growing a second thin layer of silicon oxide over the surfaces of said silicon nitride layer and conformally within said trenches;

selectively ion implanting channel-stops through said openings into said substrate underneath said trenches;

depositing a second layer of silicon oxide over the surface of said substrate and within said trenches;

etching back said second silicon oxide layer to leave spacers on the sidewalls of said trenches wherein said spacers fill said trenches within said narrow openings and wherein said spacers do not fill the central portion of said trenches within said wide openings;

covering the surface of said substrate with a dielectric material;

etching back said dielectric layer leaving said dielectric material only within said central portion of said trenches within said wide openings; and removing said silicon nitride layer and said first thin silicon oxide layer thereby completing said device isolation of said integrated circuit, 14. The method of claim 13 wherein said first thin silicon oxide layer has a preferred thickness of between about 50 to 300 Angstroms, 15. The method of claim 13 wherein said silicon nitride layer has a preferred thickness of between about 500 to 2000 Angstroms.

16. The method of claim 13 wherein said aluminum layer is sputter deposited to a preferred thickness of between about 2000 to 4000 Angstroms.

17. The method of claim 13 wherein said first silicon oxide layer is deposited to a thickness of between about 500 to 2000 Angstroms.

18. The method of claim 13 wherein said annealing of said substrate is accomplished by rapid thermal annealing at between about 600° to 750° C. for about 20 to 60 seconds.

19. The method of claim 13 wherein said first silicon oxide is removed by a hydrofluoric acid solution.

20. The method of claim 13 wherein said aluminum and said aluminum-silicon alloy are removed by dipping the wafer in a sulfuric acid.

21. The method of claim 13 wherein said second thin silicon oxide layer is grown to a thickness of between about 50 to 200 Angstroms.

22. The method of claim 13 wherein said channel-stop implantation uses boron ions with a dosage of between about 1 E 13 to 1 E 14 atoms/cm$^2$ and energy of between about 10 to 50 KeV.

23. The method of claim 13 wherein said second silicon oxide is deposited to a thickness of between about 4000 to 8000 Angstroms.

24. The method of claim 13 wherein said dielectric material is any dielectric material that can be combined with planarization schemes to fill in said wide trenches.

25. The method of claim 24 wherein said dielectric material is a borosilicate glass that is deposited to a thickness of between about 4000 to 6000 Angstroms and reflowed.

26. The method of claim 24 wherein said dielectric material is a borophosphosilicate glass that is deposited to a thickness of between about 4000 to 6000 Angstroms and reflowed.

27. The method of claim 24 wherein said dielectric material is a spin-on-glass material that is deposited to a thickness of between about 3000 to 6000 Angstroms and baked and cured.

28. The method of claim 24 wherein said dielectric material is a polyimide that is deposited to a thickness of between about 3000 to 6000 Angstroms.

* * * * *